United States Patent
Ip et al.

(10) Patent No.: US 12,479,070 B2
(45) Date of Patent: Nov. 25, 2025

(54) WAFER CHUCK WITH TUNABLE STIFFNESS MATERIAL

(71) Applicant: Tokyo Electron Limited, Tokyo (JP)

(72) Inventors: Nathan Ip, Austin, TX (US); Nima Nejadsadeghi, Dallas, TX (US)

(73) Assignee: Tokyo Electron Limited, Tokyo (JP)

( * ) Notice: Subject to any disclaimer, the term of this patent is extended or adjusted under 35 U.S.C. 154(b) by 867 days.

(21) Appl. No.: 17/727,279

(22) Filed: Apr. 22, 2022

(65) Prior Publication Data

US 2023/0234188 A1  Jul. 27, 2023

Related U.S. Application Data

(60) Provisional application No. 63/303,787, filed on Jan. 27, 2022.

(51) Int. Cl.
- *B25B 11/00* (2006.01)
- *H01L 21/66* (2006.01)
- *H01L 21/683* (2006.01)

(52) U.S. Cl.
CPC ........ *B25B 11/005* (2013.01); *H01L 21/6838* (2013.01); *H01L 22/20* (2013.01)

(58) Field of Classification Search
CPC ......... H01L 21/67092; H01L 21/67253; H01L 21/67288; H01L 21/6838; H01L 22/12; H01L 22/20; B25B 11/005
See application file for complete search history.

(56) References Cited

U.S. PATENT DOCUMENTS

| | | |
|---|---|---|
| 4,506,184 A | 3/1985 | Siddall |
| 6,650,135 B1 | 11/2003 | Mautz et al. |
| 9,466,538 B1 | 10/2016 | Skordas et al. |
| 2005/0200984 A1 | 9/2005 | Browne et al. |
| 2013/0059447 A1 | 3/2013 | McMillin et al. |
| 2014/0356983 A1 | 12/2014 | Lin et al. |
| 2021/0057263 A1 | 2/2021 | Kim et al. |

(Continued)

FOREIGN PATENT DOCUMENTS

WO  2021213961 A1  10/2021

OTHER PUBLICATIONS

Written Opinion for WO2023146861.*

(Continued)

*Primary Examiner* — Sonya M Sengupta
(74) *Attorney, Agent, or Firm* — Slater Matsil, LLP

(57) ABSTRACT

A wafer bonding apparatus including: a first chuck in a processing chamber, the first chuck being configured to hold a first wafer, the first chuck including: a chuck body, and a tunable stiffness layer including a plurality of actuators, the plurality of actuators including a tunable stiffness material, the tunable stiffness layer being disposed below the chuck body; a controller configured to send control signals to one or more of the plurality of actuators; and a vacuum line on the chuck body configured to apply a vacuum pressure from a vacuum pump to the first wafer; and a second chuck in the processing chamber, the second chuck being configured to hold a second wafer to be bonded with the first wafer; and where a stiffness of the plurality of actuators is configured to change based on the control signals from the controller.

20 Claims, 12 Drawing Sheets

(56) References Cited

U.S. PATENT DOCUMENTS

2023/0234188 A1* 7/2023 Ip ..................... H01L 21/67092

OTHER PUBLICATIONS

International Search Report and Written Opinion, PCT Application No. PCT/US2023/011457, mailed May 19, 2023, 11 pages.
Wang et al., "Controllable and reversible tuning of material rigidity for robot applications," Materials Today, vol. 21, No. 5, Jun. 2018, pp. 563-576, 14 pages total.

* cited by examiner

WAFER CHUCK WITH TUNABLE STIFFNESS MATERIAL

CROSS-REFERENCE TO RELATED APPLICATIONS

This application claims the benefit of U.S. Provisional Application No. 63/303,787, filed on Jan. 27, 2022, which application is hereby incorporated herein by reference.

TECHNICAL FIELD

The present invention relates generally to a design of wafer chuck, and, in particular embodiments, to a wafer chuck comprising a tunable stiffness material.

BACKGROUND

In semiconductor fabrication process, micro-electrical devices are created on silicon wafer substrates through deposition, patterning, etching and integration techniques. One process of joining two silicon wafers together is known as wafer bonding. Wafer bonding is a packaging technology used in the production of microelectromechanical systems (MEMS), nanoelectromechanical systems (NEMS), microelectronics and optoelectronics. In a wafer bonding process, one patterned (device) wafer may be bonded onto a blank (carrier) wafer. In another wafer bonding process, one device wafer may be bonded onto another device wafer. In both cases, the alignment between the wafers plays an important role in the overall device product performance. If the misalignment (or distortion) between the two wafers during the bonding process is large, then the electrical circuits on the device may not be connected successfully. The success of minimizing wafer bonding distortion directly relates to the yield of the devices on the wafer. The state-of-the-art distortion requirement for wafer bonding process may be less than 100 nm in 3σ variation across the wafer. Due to process variations, distortions may vary locally on the wafer. It is important to mitigate local distortion variations in addition to improving the overall distortion.

SUMMARY

In accordance with an embodiment of the present invention, a wafer bonding apparatus including: a first chuck in a processing chamber, the first chuck being configured to hold a first wafer, the first chuck including: a chuck body, and a tunable stiffness layer including a plurality of actuators, the plurality of actuators including a tunable stiffness material, the tunable stiffness layer being disposed below the chuck body; a controller configured to send control signals to one or more of the plurality of actuators; and a vacuum line on the chuck body configured to apply a vacuum pressure from a vacuum pump to the first wafer; and a second chuck in the processing chamber, the second chuck being configured to hold a second wafer to be bonded with the first wafer; and where a stiffness of the plurality of actuators is configured to change based on the control signals from the controller.

In accordance with an embodiment of the present invention, a method for wafer bonding that includes: apply vacuum pressure to a processing chamber of a wafer bonding apparatus through a first chuck; place a first wafer over the first chuck, the first wafer being held to the first chuck by the vacuum pressure, the first chuck including: a chuck body, and a tunable stiffness layer including a plurality of actuators, the plurality of actuators including a tunable stiffness material, the tunable stiffness layer being disposed below the chuck body; sending control signals to one or more of the plurality of actuators; and based on the control signals, activating the plurality of actuators to change a stiffness of the tunable stiffness layer.

In accordance with an embodiment of the present invention, a wafer bonding apparatus including: a first chuck in a processing chamber, the first chuck being configured to hold a first wafer, the first chuck including: a tunable stiffness layer including a first actuator, the first actuator including a tunable stiffness material; a controller configured to send control signals to of the first actuator; and a second chuck in the processing chamber, the second chuck being configured to hold a second wafer to be bonded with the first wafer, where a stiffness of the tunable stiffness layer is configured to change based on the control signals from the controller.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

This application relates to a design of wafer chuck, more particularly to a wafer chuck comprising a tunable stiffness material. In various embodiments, the wafer chuck is a part of a wafer bonding apparatus used in semiconductor device fabrication. In a typical wafer bonding process, it is critical to minimize local and overall distortions of wafer bonding because the misalignment between the wafers can reduce the yield of the devices on the wafer. For example, with local distortions, the middle area of the wafer may have low distortion but the wafer edge may have substantial distortion that is out of specification. This local distortion may be due to intrinsic wafer variations, preceding process variations or wafer bonding process. One solution for local distortion is to have a lower chuck equipped with multiple vacuum zones that are controlled independently. By applying varying degrees of vacuum pressure, the wafer deforms differently across different zones to correct local and overall distortions. However, the number and size of vacuum zones are limited by the number of pressure regulators available for the system. Furthermore, some of these knobs have limited tunable distortion range. Therefore, it may be desirable to design a wafer chuck utilizing a different concept for distortion correction. Embodiments of the present application disclose a wafer chuck comprising a tunable stiffness material that enables correcting local distortion by locally turning the stiffness of the wafer chuck. In various embodiments, wafer distortion during a wafer bonding process less than 100 nm in 3σ variation across the wafer may be achieved. The wafer chuck described in this disclosure may advantageously enables a system with only one vacuum zone replacing multiple vacuum zone, while providing multiple points of distortion correction. While this disclosure primarily describes embodiments of local distortion correction, the wafer chuck in various embodiments may also enable overall global distortion correction.

Figure 6:
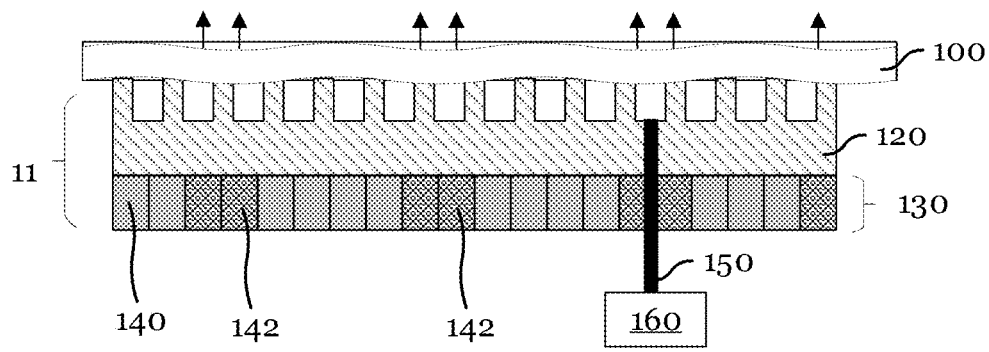
FIG. 6 illustrates a cross sectional view of an example wafer chuck comprising a tunable stiffness material while turning the stiffness of the tunable stiffness material in accordance with various embodiments.
Figure 7:
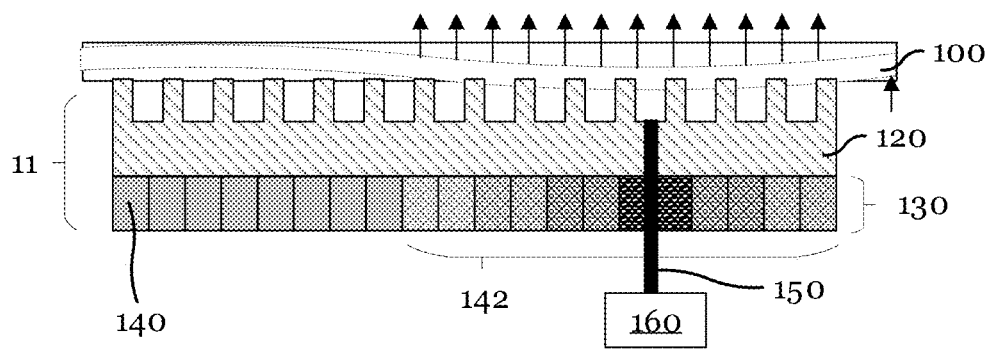
FIG. 7 illustrates a cross sectional view of another example wafer chuck comprising a tunable stiffness material while turning the stiffness of the tunable stiffness material in accordance with alternate embodiments.

In the following, the design of a wafer bonding apparatus and a wafer chuck of the wafer bonding apparatus is first described referring to FIGS. 1-3 in accordance with various embodiments. Designs of an example chuck body and tunable stiffness layer are then described referring to FIGS. 4-5. FIGS. 6-7 provides examples of the tunable stiffness layer while changing its stiffness locally. Another example wafer chuck comprising sensors to characterize a wafer held by the wafer chuck is described in FIG. 8. Vertical and lateral (e.g., shear) deformations of the tunable stiffness layer are described referring to FIGS. 9-12. FIG. 13 provides a process flow diagram of a wafer bonding process in accordance with various embodiments. The effect of chuck stiffness on various displacements on the wafer chuck is simulated and described referring to FIGS. 14-16. All figures in this disclosure are drawn for illustration purpose only and not to scale, including the aspect ratios of features. The wafer bonding apparatus may include any other useful components for wafer bonding that are not illustrated in figures. Although the description below in this disclosure is mainly for a wafer bonding apparatus, the design of wafer chuck disclosed may be applied in other systems, for example, a metrology chamber.

Figure 1:
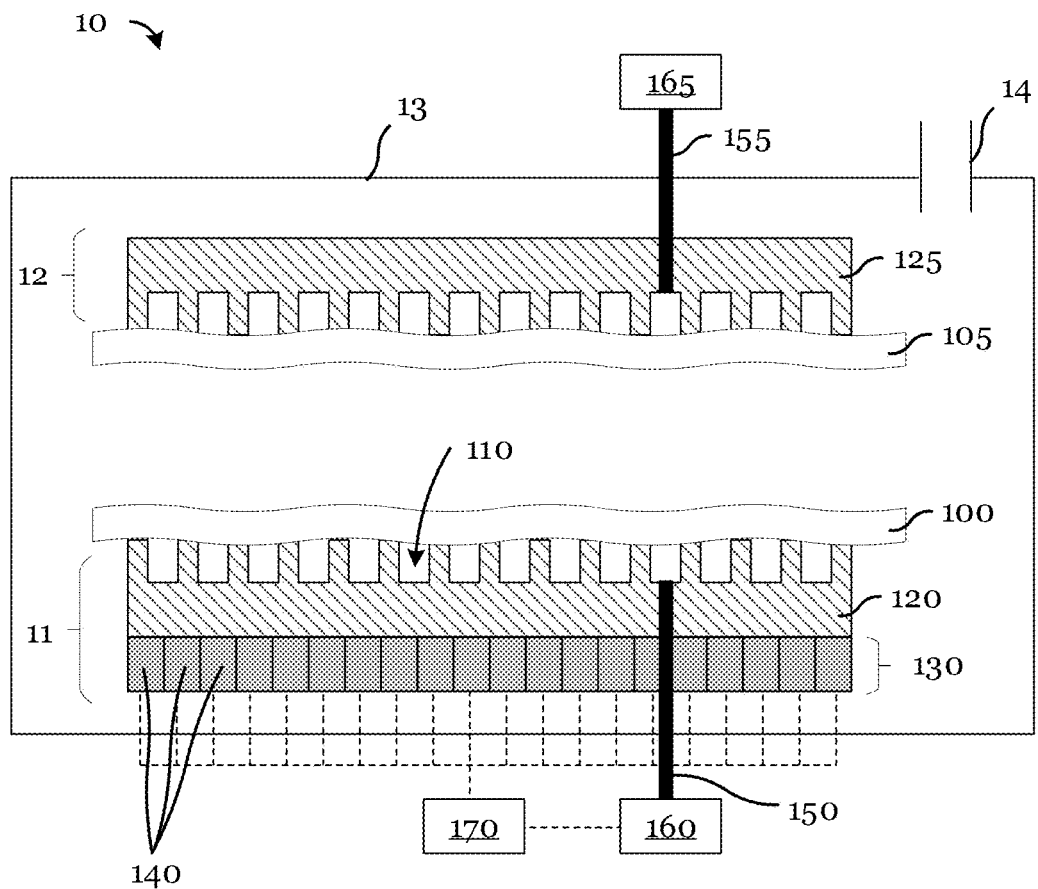
FIG. 1 illustrates a cross sectional view of an example wafer bonding apparatus comprising a tunable stiffness material in accordance with various embodiments.

FIG. 1 illustrates a cross sectional view of an example wafer bonding apparatus 10 comprising a tunable stiffness material in accordance with various embodiments.

In FIG. 1, the wafer bonding apparatus 10 comprises a lower chuck 11 and an upper chuck 12 that are configured to hold a first wafer 100 and a second wafer 105, respectively. These two wafers are to be bonded using the wafer bonding apparatus 10. In certain embodiments, the upper chuck 12 is configured to move vertically to change the position of the second wafer 105 so that the first wafer 100 and the second wafer 105 may be brought into contact for bonding during a wafer bonding process. In some embodiments, the lower chuck 11 may be configured to move vertically to move the first wafer 100. The wafer bonding apparatus 10 may be placed in a processing chamber 13, where the processing parameters for the wafer bonding process (e.g., gas environment, temperature, and pressure) can be adequately controlled. The processing chamber 13 may comprise a gas delivery/vent system 14 to control the gas environment of the processing chamber 13. In various embodiments, the wafer bonding apparatus 10 may be configured to house 200 mm or 300 mm wafers, and the sizes of the components of the wafer bonding apparatus 10 (e.g., the lower chuck 11, the upper chuck 12, and the processing chamber 13) are accordingly designed.

In various embodiments, the first wafer 100 and the second wafer 105 may comprise many semiconductor devices to be fabricated. The first wafer 100 and the second wafer 105 accordingly may comprise layers of semiconductors useful in various microelectronics. In certain embodiments, the first wafer 100 and the second wafer 105 may be a silicon wafer, or a silicon-on-insulator (SOI) wafer. In some embodiments, the first wafer 100 and the second wafer 105 may comprise a silicon germanium wafer, silicon carbide wafer, gallium arsenide wafer, gallium nitride wafer and other compound semiconductors. In other embodiments the first wafer 100 and the second wafer 105 comprise heterogeneous layers such as silicon germanium on silicon, gallium nitride on silicon, silicon carbon on silicon, as well layers of silicon on a silicon or SOI substrate.

In various embodiments, the lower chuck 11 comprises two layers: a chuck body 120 and a tunable stiffness layer 130 disposed below the chuck body 120. In various embodiments, the chuck body 120 may comprise any suitable material with a sufficient stiffness (e.g., 10 GPa/m or greater) to support the first wafer 100. In certain embodiments, the chuck body 120 may comprise aluminum. In one or more embodiments, the chuck body 120, the tunable stiffness layer 130, or both may have a thickness between 1 cm and 15 cm. As illustrated, the surface of the chuck body 120 may have grooves 110. The grooves 110 may advantageously reduce the contact area between the first wafer 100 and the chuck body 120 so that any damage on the first wafer 100 due to friction may be avoided. In certain embodiments, the chuck body 120 may have no groove or a different number of grooves from FIG. 1. The wafer bonding apparatus 10 further comprises a first vacuum system 160 coupled with the chuck body 120 via a first vacuum line 150. The first vacuum line 150 is configured to apply a vacuum pressure from the first vacuum system 160 to the first wafer 100 so that the first wafer 100 may be held by the lower chuck 11 by vacuum. Although the wafer bonding apparatus 10 in FIG. 1 is illustrated as a vacuum chuck driven by vacuum, in other embodiments, other forces may be used in the wafer bonding apparatus 10 instead of or in addition to vacuum. For example, the wafer bonding apparatus 10 may comprise an electrostatic chuck (ESC) in certain embodiments. In one embodiment, the tunable stiffness layer 130 may be positioned between the first wafer 100 and the ESC body.

Still referring to FIG. 1, the tunable stiffness layer 130 has actuators 140 comprising a tunable stiffness material. In FIG. 1, each of the actuators 140 is coupled to a controller 170, which sends control signals to the actuators 140 to change the stiffness of the actuators 140 locally. In various embodiments, local changes of stiffness in the tunable stiffness layer 130 are utilized to correct distortions before or during a wafer bonding process as further described below. In certain embodiments, as illustrated, the controller 170 may also be coupled to the first vacuum system 160 to enable dynamic control of the stiffness and vacuum. While each of the actuators 140 may be individually controlled, in other embodiments, some of the actuators 140 may be grouped to be controlled together with a single control signal.

In various embodiments, the tunable stiffness material is any material whose stiffness may be tuned by a control signal. The control signal may comprise a thermal, pressure, electric, or magnetic signal. In certain embodiments, the tunable stiffness material may be a polymer material. Some examples of the polymer material for tunable stiffness material include a shape-memory polymer that responds to a thermal or magnetic signal, granular material that responds to pressure, electroactive polymer that responds to an electric signal, or magnetorheological elastomer that responds to a magnetic signal. In one embodiment, a heat actuator that responds to a signal providing thermal energy may be used. Such a signal may be heat or an electromagnetic wave that may be absorbed by the tunable stiffness material used in the heat actuator. In another embodiment, instead of the control signal, the pressure exerted on an actuator may directly induce the stiffness change when using a pressure actuator (e.g., granular material). In some embodiments, the stiffness of the tunable stiffness material may be tuned by other mechanisms or any combination of the above signals. Other materials such as ceramic materials may also be used. In various embodiments, the tunable stiffness material has a minimum stiffness comparable to the chuck body 120 (e.g., 10 GPa/m or greater). In certain embodiments, the tunable stiffness material is capable of changing its Young's modulus by at least 100 GPa with a layer thickness of 0.1 m.

Figure 9:
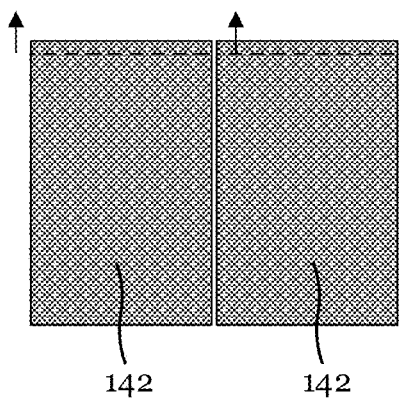
FIG. 9 illustrates a cross sectional view of example actuators comprising a tunable stiffness material inducing vertical deformation in accordance with various embodiments.
Figure 10:
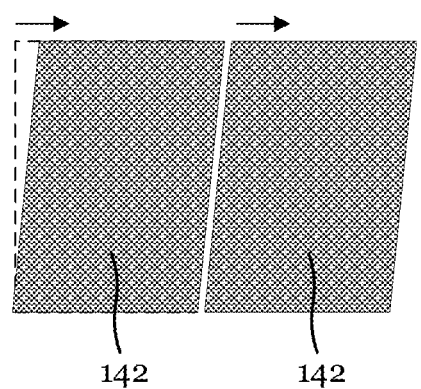
FIG. 10 illustrates a cross sectional view of example actuators comprising a tunable stiffness material inducing shear deformation in accordance with various embodiments.

In certain embodiments, the tunable stiffness material may comprise a piezoelectric material that may deform in response to a control signal. If the piezoelectric material is used for the actuators 140 of the tunable stiffness layer 130, the control signal (e.g., an electric signal) may induce a deformation of the actuators 140. The direction and degree of the deformation of the actuators 140 can be tuned so that the local distortion of the first wafer 100 may be corrected locally, as further described below (FIGS. 9 and 10). In one embodiment, the actuators 140 may comprise a 2 mm cube-shaped piezoelectric chip that is able to exert a force of 65 N and cause a deformation up to 2 μm.

In one or more embodiments, the wafer bonding apparatus may further comprise a temperature control system (e.g., a cooling system) for thermal management of the actuators 140. The thermal management may particularly be critical when controlling the actuators 140 for stiffness changes generates substantial heat that may affect the actuators 140 or surrounding components.

Figure 2:
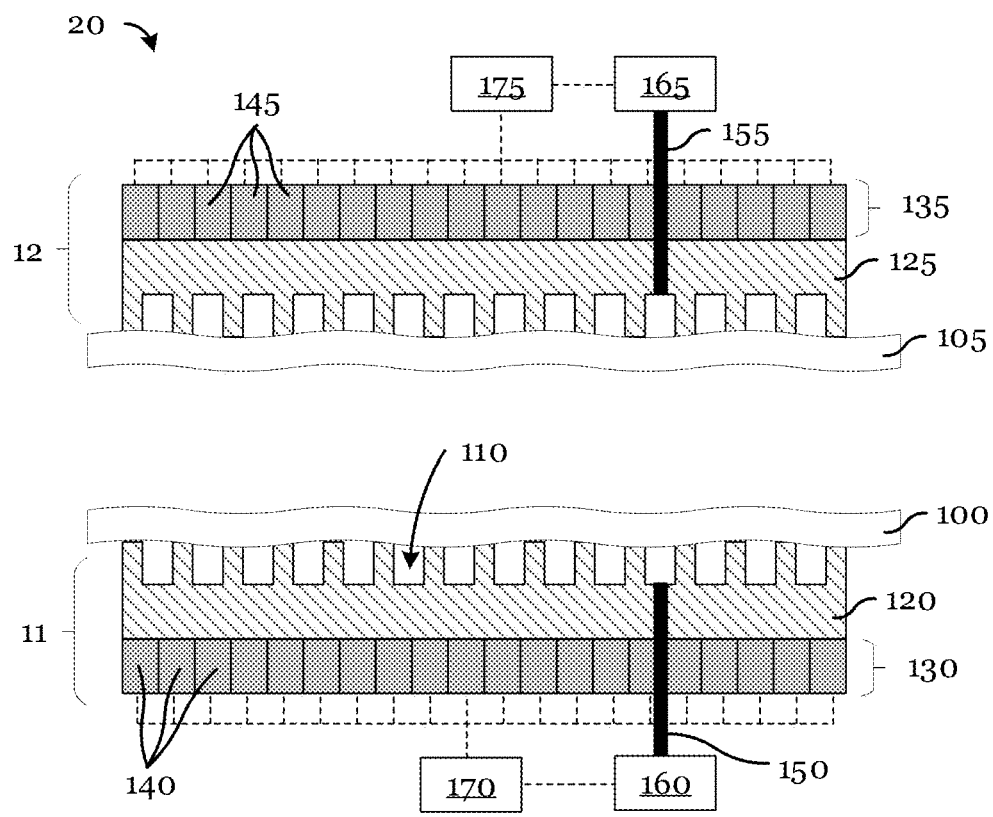
FIG. 2 illustrates a cross sectional view of another example wafer bonding apparatus comprising a tunable stiffness material in accordance with alternate embodiments.

FIG. 2 illustrates a cross sectional view of another example wafer bonding apparatus 20 comprising a tunable stiffness material in accordance with alternate embodiments.

In various embodiments, the upper chuck 12, as illustrated in FIG. 1, may comprise an upper chuck body 125, a second vacuum system 165, and a second vacuum line 155 (FIG. 1). In certain embodiments, as illustrated in FIG. 2, the upper chuck 12 may further comprise an upper tunable stiffness layer 135 above the upper chuck body 125, where the upper tunable stiffness layer 135 has actuators 145 comprising a tunable stiffness material. Similar to the lower chuck 11, each of the actuators 145 is coupled to an upper controller 175, which sends control signals to the actuators 145 to change the stiffness of the actuators 145 locally. In certain embodiments, as illustrated, the upper controller 175 may also be coupled to the second vacuum system 165 to enable dynamic control of the stiffness and vacuum. The designs of the upper chuck 12 in FIGS. 1 and 2 are only examples and any other chuck design may be used in other embodiments, whether or not the upper chuck 12 comprises a tunable stiffness material.

Figure 3:
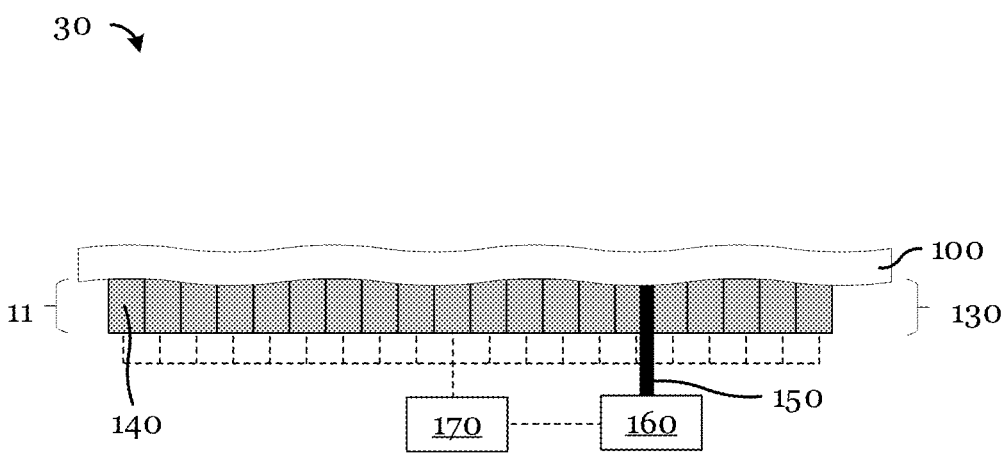
FIG. 3 illustrates a cross sectional view of an example wafer chuck comprising a tunable stiffness material in accordance with other embodiments.

FIG. 3 illustrates a cross sectional view of an example lower wafer chuck 11 comprising a tunable stiffness material in accordance with other embodiments.

In FIG. 3, unlike prior embodiments with a two-layer structure for a lower chuck, the lower chuck 11 may comprise a tunable stiffness layer 130 that constitutes a chuck body and is configured to be in contact with a first wafer 100. Such embodiments may advantageously simply the chuck design and be beneficial in translating the stiffness change in the tunable stiffness layer 130 to the first wafer 100 for local distortion correction. The other features of the lower chuck 11 such as a vacuum system 160 are the same as the prior embodiments illustrates in FIGS. 1 and 2 and thereby not repeated. In the following figures where a wafer bonding apparatus is illustrated (FIGS. 6-8), only a lower chuck is illustrated for illustration purpose, without an upper chuck and some features of the lower chuck (e.g., a controller 170). In various embodiments, however, these features are assumed to be present in the examples illustrated.

Figure 4:
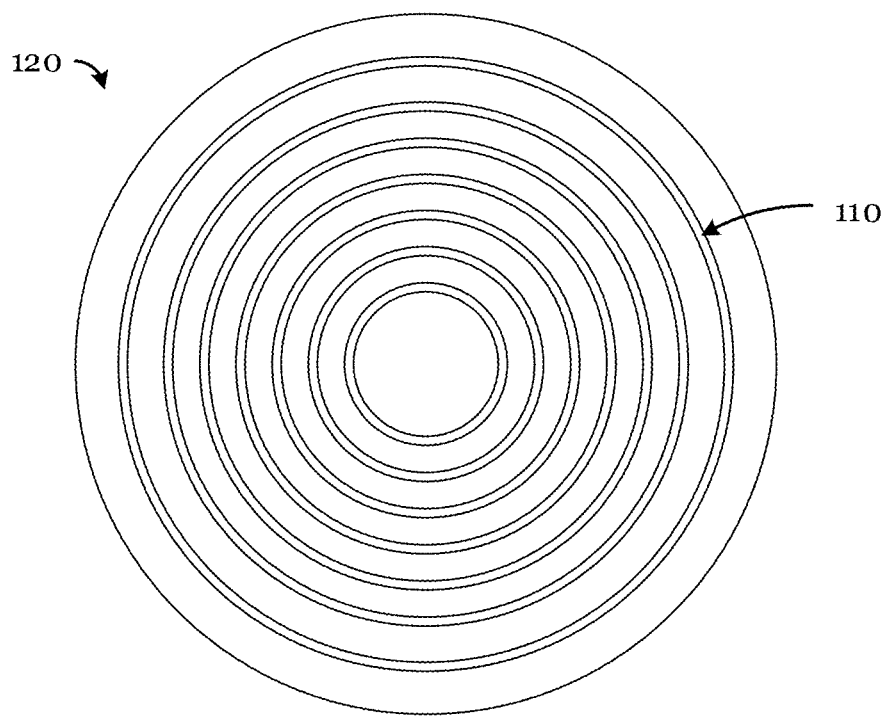
FIG. 4 illustrates a top view of a chuck body of an example wafer chuck in accordance with various embodiments.

FIG. 4 illustrates a top view of a chuck body 120 of an example wafer chuck in accordance with various embodiments.

In FIG. 4, seven grooves 110 are provided as circular grooves. The grooves 110 have a common center and are distributed on the surface of the chuck body 120. In other embodiments, the grooves 110 may have different shapes such as squares, ellipses, and others, or a more or less number of grooves.

Figure 5:
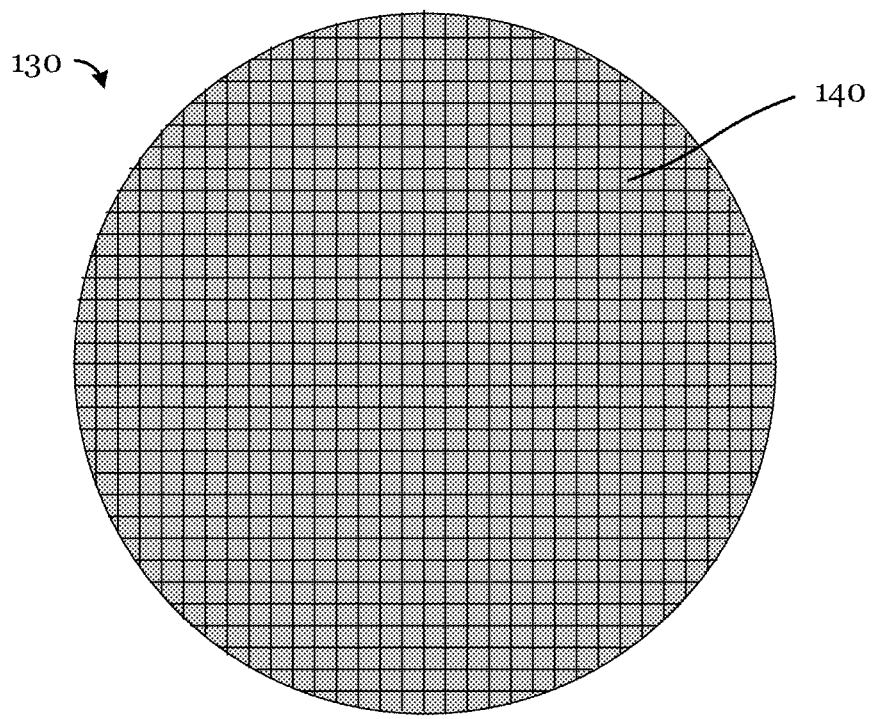
FIG. 5 illustrates a top view of a tunable stiffness layer of an example wafer chuck in accordance with various embodiments.

FIG. 5 illustrates a top view of a tunable stiffness layer 130 of an example wafer chuck in accordance with various embodiments. Although a chuck body 120 may be disposed over the tunable stiffness layer 130, it is not illustrated in FIG. 5 for illustration purpose.

In FIG. 5, the tunable stiffness layer 130 are divided into multiple square sections by grids (e.g., more than 500 sections in FIG. 5), where each of the square sections may be made of actuators 140 that is individually tunable for its stiffness. The size and number of the square sections illustrated in FIG. 5 are an example and a different size and number may be selected for the square sections. In various embodiments, there may be 700 to 18,000 square sections provided on the tunable stiffness layer 130. In certain embodiments, a side of the square sections may be between 2 mm and 10 mm. In other embodiments, the shape of the sections may also be different from square, for example triangle. In various embodiments, each of the sections may be used for the actuators 140 but in other embodiments, a portion of the sections may be selected for the actuators 140. By increasing the number of the sections on the tunable stiffness layer 130 and accordingly the number of the actuators 140, local distortions of the first wafer 100 may be corrected with an improved vertical and lateral resolution. On the other hand, reducing the number of the sections and the number of the actuators 140 may be advantageous in simplifying the wafer chuck design and thereby the manufacturing cost of the wafer chuck. In certain embodiments, the actuators 140 may be separated from each other, advantageously providing a space for lateral deformation correction.

FIG. 6 illustrates a cross sectional view of an example lower chuck 11 comprising a tunable stiffness material while turning the stiffness of the tunable stiffness material in accordance with various embodiments.

In FIG. 6, the lower chuck 11 may have the same features as previously illustrated in FIGS. 1 and 2, and some of the actuators 140 are activated for stiffness change (illustrated as activated actuators 142), enabling local distortion correction of a first wafer 100. An initial state of the first wafer 100 is illustrated with a dotted line, where local distortions are present with several dents. Local distortions of the first wafer 100 may be attributed to, for example, different pressures at different locations. These local distortions may be corrected utilizing the tunable stiffness layer 130. When activated, the actuators 140 comprising the tunable stiffness material can change their stiffness. In the illustrated example, the actuators 140 below the dented areas of the first wafer 100 may be activated to increase their stiffness so that the distortion of the first wafer 100 may be locally offset. As a result of this local distortion correction as indicated by arrows in FIG. 6, the dent of the first wafer 100 may be eliminated or minimized. The first wafer 100 locally corrected by the activated actuators 142 is illustrated with a solid line.

FIG. 7 illustrates a cross sectional view of another example lower chuck 11 comprising a tunable stiffness material while turning the stiffness of the tunable stiffness material in accordance with alternate embodiments.

In FIG. 7, the first wafer 100 before local distortion correction has only one dent centered at the position of the vacuum line 150 as indicated by a dotted line. The dent is larger and deeper compared to the dents in FIG. 6. Similar to FIG. 6, the local distortion correction may be performed by activating some of the actuators 140. While separate regions of the actuators 140 are activated in FIG. 6, in these embodiments of FIG. 7, only one region of the actuators 140 are activated, but providing several discrete degrees of stiffness change for the activated actuators 142 across the tunable stiffness layer 130. The degree of stiffness change of the activated actuators 412 is illustrated qualitatively by the difference in contrast in FIG. 7 and the size of arrows. The stiffness change of the tunable stiffness layer may be locally tuned to be larger near the first vacuum line 150, where the initial dent is the largest, and to become smaller for locations farther from the vacuum line 150 as the initial dent becomes smaller.

As illustrated in FIGS. 6 and 7, the wafer bonding apparatus 10 may enable local distortion correction. In these examples, the first wafer 100 is locally distorted having a surface strain. Accordingly, a change in the stiffness of the tunable stiffness layer is configured to compensate the surface strain at the surface of the first wafer 100 facing the lower chuck 11. Alternately, information on the change in the stiffness of the tunable stiffness layer necessary for anticipated local distortion correction may be stored in a memory, and the stiffness change may be controlled accordingly, even before the first wafer 100 may cause the surface strain (i.e., distortion).

Various embodiments may be also used in other conditions such as plane stress or plane strain conditions. For example, in some embodiments, the change in the stiffness of the tunable stiffness layer is configured to compensate a residual surface stress at the surface of the first wafer 100, in plane strain, facing the lower chuck 11.

Although FIGS. 6 and 7 are illustrated to primarily describe correcting the local distortion based on the wafer shape on the lower chuck 11 before the wafer bonding process, the stiffness change may be further utilized for local distortion correction when the first wafer 100 is being bonded with the second wafer 105. The wafer bonding process may also cause some distortion. The bonding process-derived distortion may also be offset by tuning the stiffness of the tunable stiffness layer 130 to minimize or eliminate the total distortion. In certain embodiments, with the stiffness changes for local distortion correction, the surface of the lower chuck 11 may or may not be a flat surface.

Since the wafer bonding apparatus with the tunable stiffness material in various embodiments is capable of local distortion correction based on the stiffness change, this design of the wafer bonding apparatus may advantageously eliminate the need of multiple vacuum zones in a conventional apparatus and replace with only one vacuum zone per chuck as illustrated in FIGS. 1-3 and 6-8. Replacing the multiple vacuum zone with one vacuum zone may substantially simplifies the wafer chuck design, reduce the cost, and save space. Compared to vacuum lines required for multiple vacuum zones, spaces required for actuators and control circuits may substantially smaller. Alternately, in a wafer chuck design with multiple vacuum zones, adding the tunable stiffness layer may advantageously provide additional control parameters that can supplement the local distortion corrections by vacuum control.

In various embodiments, the actuators 140 may be individually controlled to provide ideal stiffness by sending a control signal from the controller 170 to the actuators 140. To this end, an incoming wafer may be characterized for its shape so that the type and degree of overall (global) and local distortion may be determined prior to distortion correction and a wafer bonding process. In certain embodiments, such measurements may be performed in a separate metrology system but in other embodiments in the processing chamber for the wafer bonding process. Further, the measurements may be performed at various stages, i.e., before, during, or after the wafer bonding process. With an appropriate sensing system coupled to the processing chamber, real-time measurement of the first wafer 100 during the local distortion correction may be enabled. In various embodiments, a process of local distortion correction may comprise determining the control signal based on the wafer shape measurements, which may also include determining which one or more of the actuators 140 may be activated according to the control signal.

In certain embodiments, based on multiple measurements of the wafer shape, distortion correction may be performed with more than one mode. For example, local distortion correction may be performed first prior to bonding the two wafers based on a first measurement, and after the two wafers are brought in contact, local or overall distortion correction may be performed based on a second measurement. This may be particularly useful because, when the two wafers are brought in contact, an additional force may be exerted onto the first wafer 100, possibly causing a change in the local and/or overall distortion. The second measurement of the wafer shape may therefore be utilized to update control signals and fine tune the actuators 140.

Figure 8:
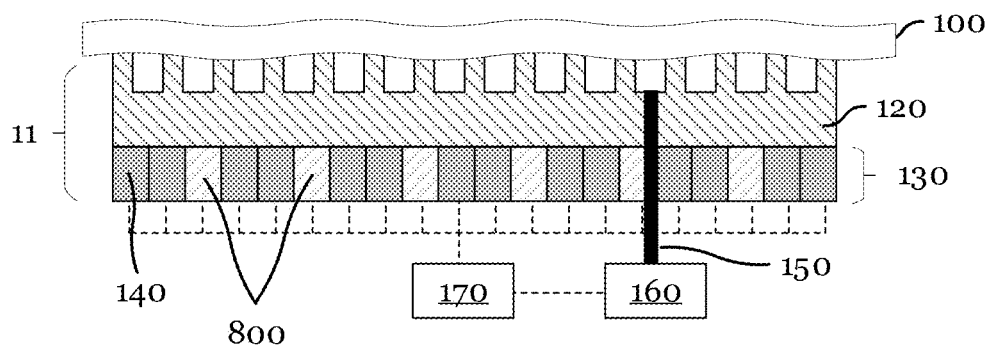
FIG. 8 illustrates a cross sectional view of an example wafer chuck comprising a tunable stiffness material and sensors in accordance with various embodiments.

FIG. 8 illustrates a cross sectional view of an example lower chuck 11 comprising a tunable stiffness material and sensors 800 in accordance with various embodiments.

In FIG. 8, all features of the lower chuck 11 except the sensors 800 are the same as the prior embodiments illustrates in FIGS. 1 and 2 and thereby not repeated. Some sections of the tunable stiffness layer 130 may comprise the sensors 800 to enable real-time measurement of the first wafer 100 during the local distortion correction. For example, the sensors 800 may comprise pressure sensors to locally measure the pressure on the first wafer 100 to identify areas with relatively high vacuum pressure. In certain embodiments, the pressure data may be collected prior to a process of distortion correction. According to the data collected by the pressure sensors, a pressure map may be generated and used to determine the actuators 140 to be activated and the degree of stiffness change to be achieved. In further embodiments, during the distortion correction, after activating some of the actuators 140, a new set of data may be collected to determine if the local distortion is sufficiently corrected. In one embodiment, a threshold of acceptable distortion may be predetermined, and if the new set of data indicates that the corrected distortion is below the threshold, the wafer bonding process may proceed to a next step. If the corrected distortion is above the threshold, on the other hand, the actuators 140 may be tuned to further minimize the local distortion. In various embodiments, the wafer bonding apparatus 10 may comprise a microprocessor having a program to execute a process of local distortion correction, for example, comprising steps described above.

FIG. 9 illustrates a cross sectional view of example activated actuators 142 inducing vertical deformation in accordance with various embodiments.

In FIG. 9, two activated actuators 142 of the tunable stiffness layer comprising a piezoelectric material are illustrated. A dotted line indicates an initial position of the top surface of the actuators. In response to a control signal, the piezoelectric material deforms. In the illustrated example, the actuators are disposed in such a way that the deformation occurs in the vertical direction. In certain embodiments, when activated by the control signal, the piezoelectric material may extend in the vertical direction, raising the top surface as indicated by arrows in FIG. 9. By identifying which actuators can be activated and selectively activating those actuators, it is possible to induce a vertical deformation on the tunable stiffness layer locally. Such a local deformation of the tunable stiffness layer may be utilized for local distortion correction of the first wafer 100. In one embodiment, the degree of deformation of the piezoelectric material may be adjusted in the vertical direction by 10 nm to 5 μm at one location of the first wafer 100. In certain embodiments, the first wafer 100 may be chucked by vacuum before activating the actuators, but in other embodiments after activating the actuators.

FIG. 10 illustrates a cross sectional view of example activated actuators 142 inducing shear deformation in accordance with various embodiments.

In addition to or in place of deformation in the vertical deformation, the piezoelectric material may also induce a deformation of the actuators in lateral direction (e.g., a shear deformation as illustrated in FIG. 10 induced by a piezoelectric shear actuator). A dotted line indicates an initial position of the actuators. In one embodiment, when activated by the control signal, the piezoelectric material may induce shear deformation as indicated by arrows in FIG. 10.

In various embodiments, the first wafer 100 may be first chucked by vacuum. With a sufficient vacuum pressure applied to the first wafer 100, this shear deformation of the actuators may then be translated to the first wafer 100, enabling a local distortion correction in the lateral direction. In certain embodiments, the shear deformation of the actuators may be first translated to the chuck body 120 and the deformation of the chuck body 120 may then be translated to the first wafer 100, which may advantageously smoothens the deformation caused on the first wafer 100. In other embodiments, the tunable stiffness layer 130 comprising the actuators may be in direct contact with the first wafer 100, and thereby the deformation of the actuators may be directly and efficiently translated to the first wafer 100. In various embodiments, the bottom side of the actuators may be fixed to a base to enable translating the lateral deformation to the first wafer 100. In one embodiment, the degree of deformation of the piezoelectric material may be adjusted in the lateral direction by 1 nm to 50 nm at one location of the first wafer 100.

Figure 11:
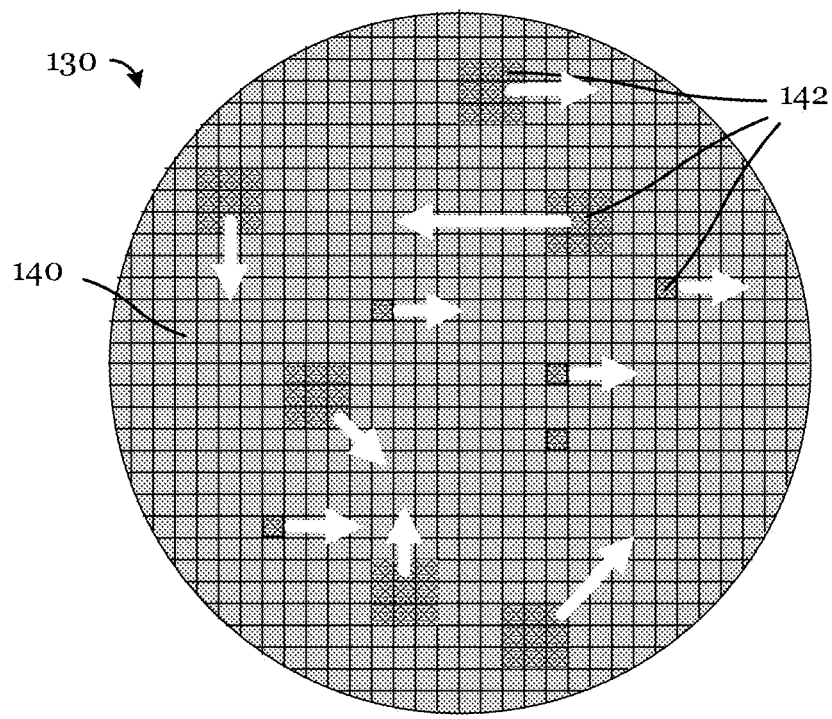
FIG. 11 illustrates a top view of a tunable stiffness layer with shear deformation in accordance with one embodiment.

FIG. 11 illustrates a top view of a tunable stiffness layer 130 with shear deformation in accordance with one embodiment.

In FIG. 11, an example of local distortion correction is illustrated with a subset of the actuators 140 being activated (i.e., the activated actuators 142). The subset consists of ten isolated regions with different size in the illustrated embodiment for example, but in other embodiments, any arrangement of the actuators for a subset is possible. Arrows in FIG. 11 indicate the direction and the degree of shear deformation on a top surface of the tunable stiffness layer 130. Each of the isolated regions induces shear deformation according to the control signal received from the controller 170, and as indicated by the arrows, the direction and degree of the shear deformation may be individually determined for each of the isolated regions. For instance, each region may have actuators that are configured to actuate in the x-direction and y-direction (i.e., two orthogonal directions on a wafer surface). By varying the amount of actuation, any effective actuation direction may be achieved.

In various embodiments, this local distortion correction may be performed on the first wafer 100 before the second wafer 105 is brought in contact with the first wafer 100. In certain embodiments, the local distortion correction may be performed during the wafer bonding process, while the second wafer 105 is in contact with the first wafer 100.

Figure 12:
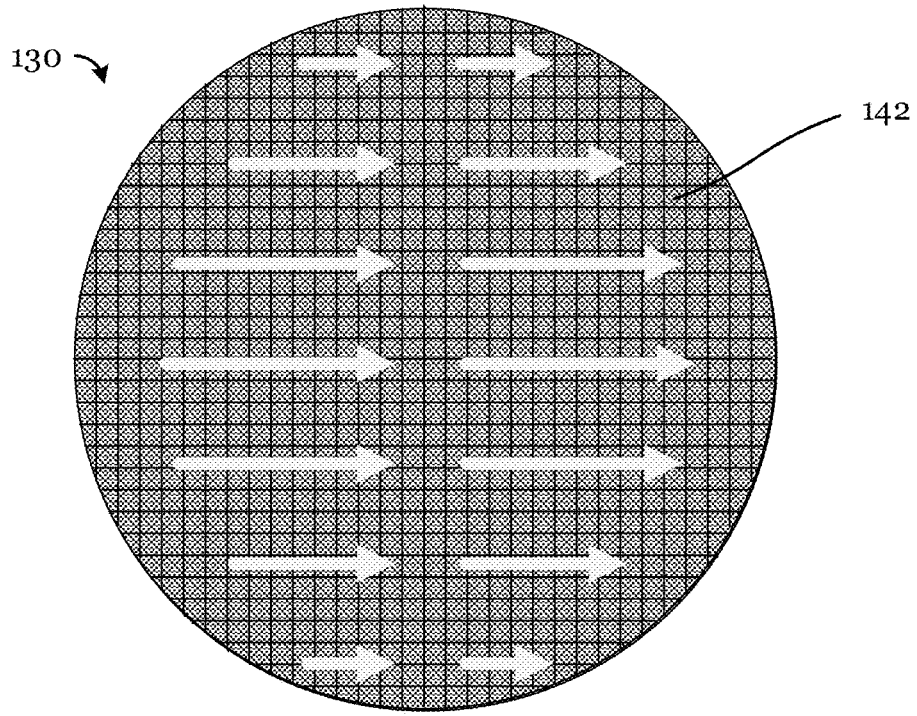
FIG. 12 illustrates a top view of a tunable stiffness layer with shear deformation in accordance with another embodiment.
Figure 13:
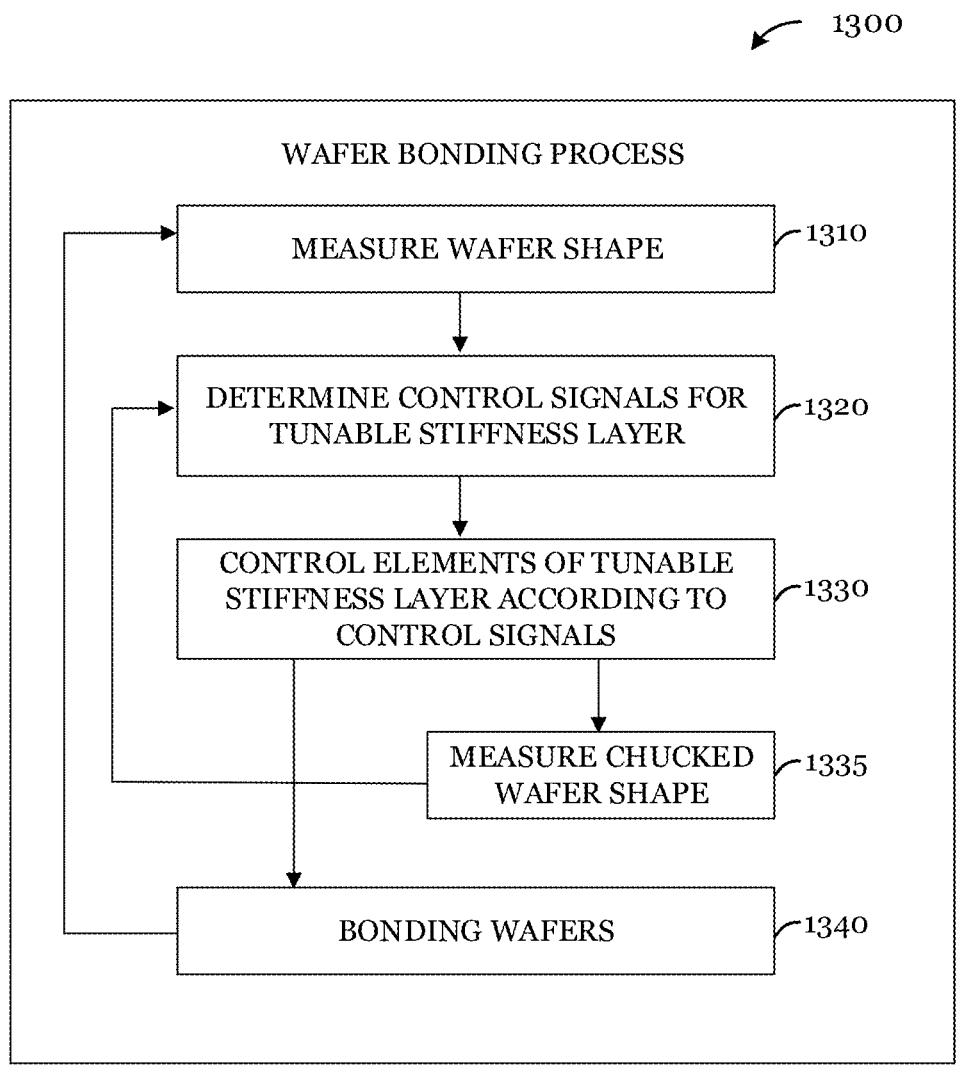
FIG. 13 illustrates a process flow diagram of a wafer bonding process in accordance with various embodiments.

FIG. 12 illustrates a top view of a tunable stiffness layer 130 with shear deformation in accordance with another embodiment.

In FIG. 12, an example of overall distortion correction is illustrated with all of the actuators 140 being activated (i.e., the activated actuators 142). Arrows in FIG. 12 indicate the direction of shear deformation on a top surface of the tunable stiffness layer 130. When all of the actuators 140 are synchronized and deformed in one direction with the same degree, it may not result in local distortion correction. However, the entire top surface of the tunable stiffness layer 130 may be displaced to reduce misalignment between the two wafers. In various embodiments, this mode of controlling the actuators 140 may be utilize to fine tune the position of the first wafer 100 relative to the second wafer 105 before or during the wafer bonding process. Alternately, by synchronizing all of the actuators 140 in one direction but with different degrees, local distortion correction may also be enabled.

FIG. 13 illustrates a process flow diagram of a wafer bonding process 1300 in accordance with various embodiments.

In FIG. 13, a process flow of the wafer bonding process 1300 for a first wafer and a second wafer starts with measuring a wafer shape to characterize a degree of distortion of the first wafer (block 1310). This measurement to obtain information related to the degree of distortion may be performed in a processing chamber for the wafer bonding process using sensors or in a separate metrology system prior to transferring the wafer to the processing chamber. Based on the data from the measurement, control signals for a tunable stiffness layer of a lower wafer chuck may be determined and sent to a controller coupled to the actuators of the tunable stiffness layer (block 1320). In one embodiment, the data from the measure may also be utilized to adjust the vacuum pressure applied to the first wafer. Next, one or more of the actuators are controlled according to the control signals received from the controller (block 1330). Once the process of local distortion correction is complete, the two wafers may be bonded (block 1340).

In certain embodiments, the steps of measuring the wafer shape, determining and sending the control signals, and controlling the actuators may repeatedly be performed. In one or more embodiments, after one or more of the actuators are controlled (block 1330) and prior to the bonding (block 1340), the shape of the wafer on the chuck (i.e., the chucked wafer) may be measured again (block 1335), and further correction of distortion may be achieved by repeating the steps of determining and sending the control signals (blocks 1320 and 1330). Such a cyclic embodiment is also possible including the bonding step (block 140). For example, a threshold value may be set for the degree of distortion acceptable for device fabrication, and if the final degree of distortion after the wafer bonding (block 1340) is not acceptable (i.e., greater than the threshold value), the bonded wafer may be separated and bonded again according to an updated process recipe. The process recipe may be updated based on the final degree of distortion from the previous bonding process. In alternate embodiments, a similarly updated process recipe may be utilized for a next set of wafers to be bonded. In one or more embodiments, the wafer bonding process (block 1340) and changing the stiffness of the tunable stiffness layer (block 1330) may be overlapped in time or proceed simultaneously. In other words, the information related to the degree of distortion may be obtained prior to, during, and/or after the bonding step (block 1340), and may be utilized to update the control signals to minimize the local/global distortion. Accordingly, the measurement of the wafer shape (block 1310) may be for the first wafer or the bonded wafer.

In various embodiments, the local distortion correction based on stiffness change may provide a wider range of tunability for distortion correction. For example, while a maximum pressure differential is less than about 100 kPa with a vacuum zone only, an equivalent pressure differential of greater than 100 kPa may be enabled when utilizing the stiffness change for the local distortion correction.

In certain embodiments, the wafer bonding process may use a process model and comprise an optimization step for the model. For example, the process model may comprise a distribution map for control signals (e.g., voltage values to send electric signals to the actuators) for a desired wafer shape, and the optimization step may be used to update the distribution map based on the measurement of an incoming wafer.

In various embodiments, two wafers may be bonded (block 1340) by a conventional method, for example, fusion bonding (also commonly referred to as direct bonding). In embodiments of fusion bonding, the wafers are brought together and the two wafers begin to bond as the surfaces of the wafers begin to touch, forming a post-bond wafer. Annealing of the post-bond wafers at elevated temperatures may then be performed to increase the bond strength between the two wafers and forms a fusion bonded wafer. Examples of process conditions for wafer bonding include bonding temperature, environmental conditions in a processing chamber, and applied force among others.

Figure 14:
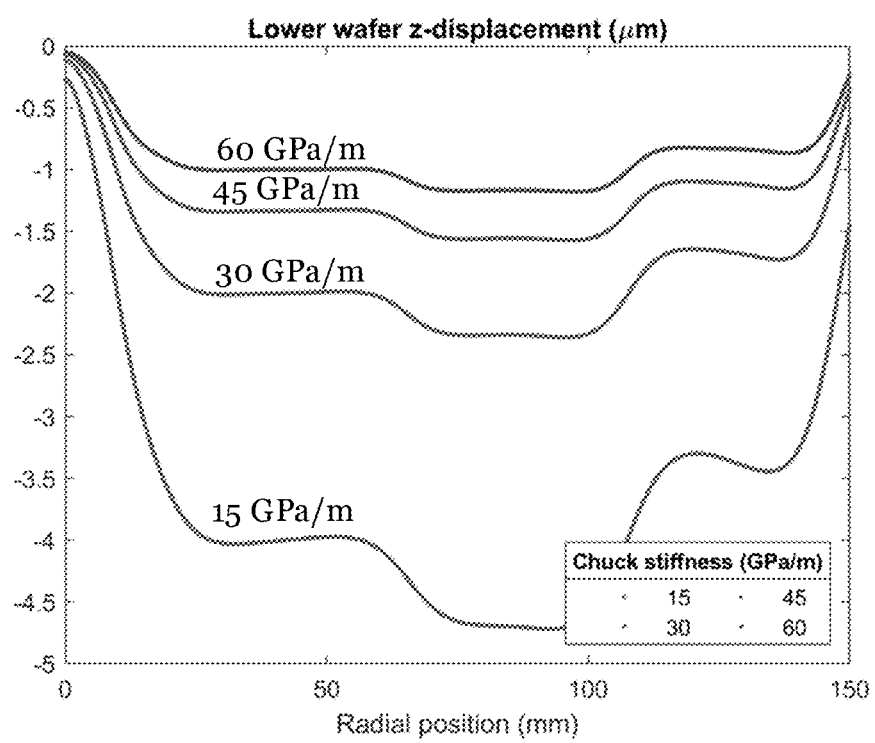
FIG. 14 illustrates a simulated effect of chuck stiffness on vertical displacement.

FIG. 14 illustrates a graph of a simulated effect of chuck stiffness on vertical displacement.

Finite element simulations of a first wafer held onto a lower chuck by vacuum are performed to study the effect of chuck stiffness on displacement. In each simulation, the chuck stiffness is set to a specified value. The stiffness is expressed as per area basis. In FIG. 14, the effect of chuck stiffness on the displacement in the vertical direction (z-direction) on the lower wafer chuck is illustrated as a function of the radial position. The effect was simulated at four different chuck stiffness values (15, 30, 45, and 60 GPa/m) for a 300 mm wafer (i.e., the radius of 150 mm). At all four chuck stiffness values, the vertical displacement shows three plateau regions: a first plateau region at around 25-60 mm, a second plateau region at around 75-100 mm, and a third plateau region at around 120-130 mm. For example, at 15 GPa/m, the vertical displacement is around −4 μm for the first plateau region, around −4.7 μm for the second plateau region, and around −3.2~−3.5 μm for the third plateau region. Between the plateau regions are transition regions where the vertical displacement transitions from one level to another. While these general trend across the wafer is common in all the four chuck stiffness values, the vertical displacement becomes smaller as the chuck stiffness value increases. For example, at 60 GPa/m, the vertical displacement is only around −1 μm for the first plateau region, which is about a quarter of the vertical displacement at 15 GPa/m. Accordingly, this reduction of the vertical displacement demonstrates that the increase in chuck stiffness can be used to correct local distortion on the wafer in the vertical direction.

Figure 15:
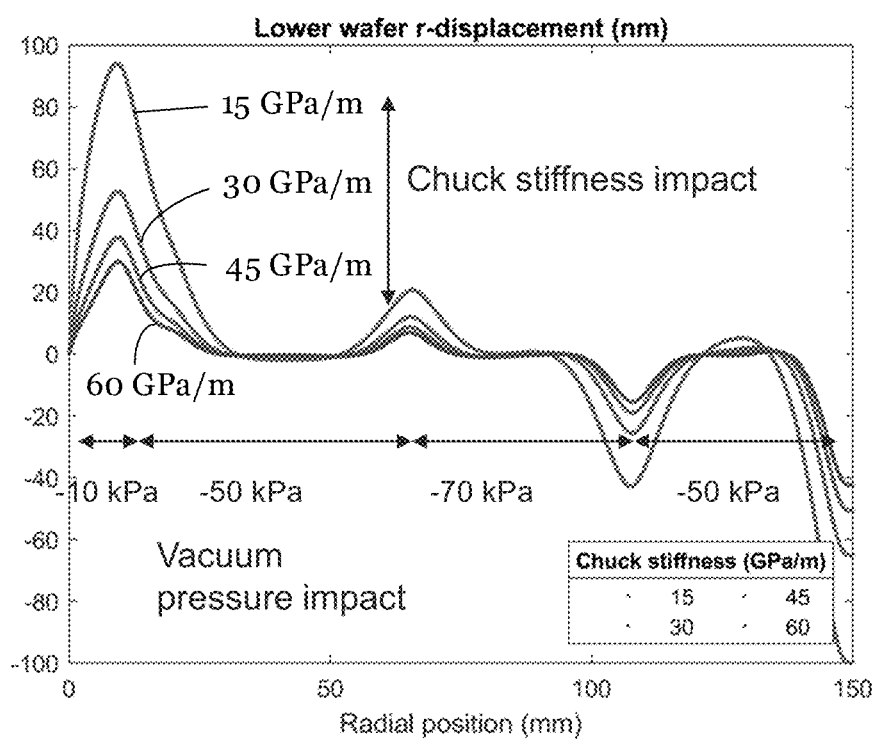
FIG. 15 illustrates a simulated effect of chuck stiffness and vacuum pressure on lateral displacement.

FIG. 15 illustrates a simulated effect of chuck stiffness and vacuum pressure on lateral displacement.

In FIG. 15, the effect of chuck stiffness and vacuum pressure on the displacement in the lateral direction (r-direction) on the lower wafer chuck is illustrated as a function of the radial position. In addition to the same four chuck stiffness values in FIG. 12, three different vacuum pressure values (−10, −50, and −70 kPa) are used as variables for the simulation. At all four chuck stiffness values, the lateral displacement shows four peaks: a first peak at around 0-25 mm, a second peak at around 60-70 mm, a third peak at around 100-120 mm, and a fourth peak at around 140-150 mm. For example, at 15 GPa/m, the lateral displacement is around 95 nm for the first peak, around 20 nm for the second peak, around −40 μm for the third peak, and −100 nm for the fourth peak. As the chuck stiffness value increases, the lateral displacement becomes smaller. For example, at 60 GPa/m, the lateral displacement is only around 5 nm for the second peak, which is about a quarter of the lateral displacement at 15 GPa/m. Similar to FIG. 12, the simulated result demonstrates that the increase in chuck stiffness can also be used to correct local distortion on the wafer in the lateral direction although the displacement may be several orders of magnitude smaller than in the vertical direction.

Figure 16:
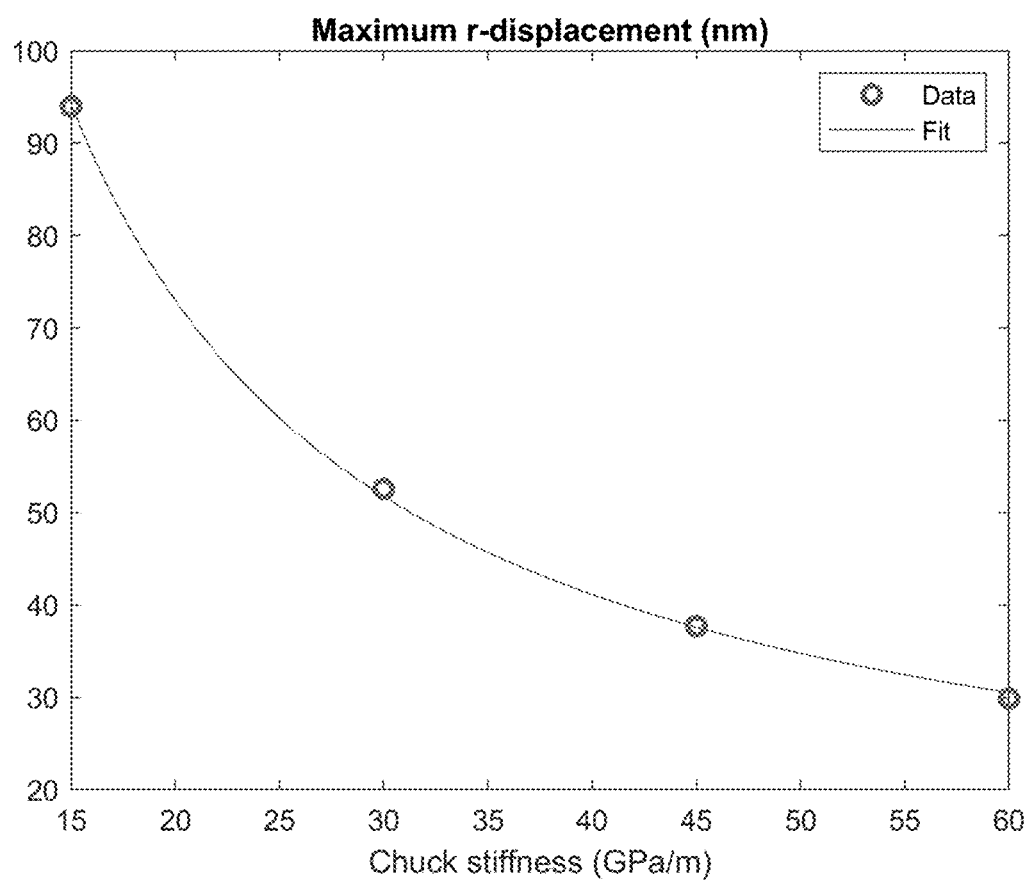
FIG. 16 illustrates simulated maximum lateral displacement as a function of chuck stiffness at a vacuum pressure difference of 10 kPa.

FIG. 16 illustrates simulated maximum lateral displacement as a function of chuck stiffness at a vacuum pressure difference of 10 kPa.

In FIG. 16, the maximum lateral displacement decreases as the chuck stiffness increases. This trend is consistent with the indication from FIG. 15. The maximum lateral displacement was about 95 nm at 15 GPa, and it gradually drops to about 30 nm at 60 GPa/m.

Example embodiments are summarized here. Other embodiments can also be understood from the entirety of the specification as well as the claims filed herein. Reference numerals are added below for illustration purposes only and the various examples could be implemented differently and are not to be construed as being limited to only these illustrations.

Example 1. A wafer bonding apparatus including: a first chuck in a processing chamber, the first chuck being configured to hold a first wafer, the first chuck including: a chuck body, and a tunable stiffness layer including a plurality of actuators, the plurality of actuators including a tunable stiffness material, the tunable stiffness layer being disposed below the chuck body; a controller configured to send control signals to one or more of the plurality of actuators; and a vacuum line on the chuck body configured to apply a vacuum pressure from a vacuum pump to the first wafer; and a second chuck in the processing chamber, the second chuck being configured to hold a second wafer to be bonded with the first wafer; and where a stiffness of the plurality of actuators is configured to change based on the control signals from the controller.

Example 2. The wafer bonding apparatus of example 1, where a change in the stiffness of the plurality of actuators is configured to compensate a surface stress at a surface of the first wafer facing the first chuck.

Example 3. The wafer bonding apparatus of one of examples 1 or 2, where a change in the stiffness of the plurality of actuators is configured to compensate a surface strain at a surface of the first wafer facing the first chuck.

Example 4. The wafer bonding apparatus of one of examples 1 to 3, where the plurality of actuators include a heat actuator, where the tunable stiffness material includes a shape-memory material, and where the control signals are configured to provide thermal energy to the heat actuator.

Example 5. The wafer bonding apparatus of one of examples 1 to 4, where the plurality of actuators include a pressure actuator, where the tunable stiffness material includes a granular material, and where a stiffness of the tunable stiffness material changes based on a pressure exerted on the pressure actuator.

Example 6. The wafer bonding apparatus of one of examples 1 to 5, where the plurality of actuators include an electric actuator, where the tunable stiffness material includes a piezo-sensitive material, and where the control signals include electrical signals.

Example 7. The wafer bonding apparatus of one of examples 1 to 6, where the plurality of actuators include a magnetic actuator, where the tunable stiffness material includes a magnetorheological elastomer, and where the control signals include magnetic signals.

Example 8. The wafer bonding apparatus of one of examples 1 to 7, where the controller determines the control signals according to information related to a degree of distortion of the first wafer on the first chuck.

Example 9. The wafer bonding apparatus of one of examples 1 to 8, further including a metrology system, the metrology system includes a sensor configured to sense the degree of distortion of the first wafer on the first chuck.

Example 10. A method for wafer bonding that includes: apply vacuum pressure to a processing chamber of a wafer bonding apparatus through a first chuck; place a first wafer over the first chuck, the first wafer being held to the first chuck by the vacuum pressure, the first chuck including: a chuck body, and a tunable stiffness layer including a plurality of actuators, the plurality of actuators including a tunable stiffness material, the tunable stiffness layer being disposed below the chuck body; sending control signals to one or more of the plurality of actuators; and based on the control signals, activating the one or more of the plurality of actuators to change a stiffness of the tunable stiffness layer.

Example 11. The method of example 10, where changing the stiffness of the plurality of actuators compensates a surface stress at a surface of the first wafer facing the first chuck.

Example 12. The method of one of examples 10 or 11, further including: receiving, from a metrology system, information related to a degree of distortion of the first wafer on the first chuck; and determining, at a controller, the control signals according to the information.

Example 13. The method of one of examples 10 to 12, where the metrology system is a part of the processing chamber, further including adjusting the vacuum pressure based on the information.

Example 14. The method of one of examples 10 to 13, further including: placing a second wafer on a second chuck within the processing chamber; and bonding the second wafer with the first wafer to form a bonded wafer.

Example 15. The method of one of examples 10 to 14, further including: after placing the second wafer on the second chuck, sending another control signals to another plurality of actuators of the tunable stiffness layer, the another plurality of actuators including the tunable stiffness material; and based on the another control signals, activating the another plurality of actuators to further change the stiffness of the tunable stiffness layer, the another control signals indicative of a different setting of the stiffness of the tunable stiffness layer than the control signals.

Example 16. The method of one of examples 10 to 15, further including after bonding the second wafer with the first wafer, receiving information related to a degree of distortion of the bonded wafer on the first chuck.

Example 17. The method of one of examples 10 to 16, further including: based on the information related to the degree of distortion of the bonded wafer, determine if the degree of distortion of the bonded wafer is below a threshold value; and if the degree of distortion of the bonded wafer is greater than the threshold value, perform a re-bonding process by separating the bonded wafer into the first wafer and the second wafer and bonding the second wafer with the first wafer again.

Example 18. A wafer bonding apparatus including: a first chuck in a processing chamber, the first chuck being configured to hold a first wafer, the first chuck including: a tunable stiffness layer including a first actuator, the first actuator including a tunable stiffness material; a controller configured to send control signals to the first actuator; and a second chuck in the processing chamber, the second chuck being configured to hold a second wafer to be bonded with the first wafer, where a stiffness of the tunable stiffness layer is configured to change based on the control signals from the controller.

Example 19. The apparatus of example 18, further including: a plurality of actuators coupled to the controller and configured to receive further control signals from the controller, where the stiffness of the tunable stiffness layer is configured to change based on the further control signals.

Example 20. The apparatus of one of examples 18 or 19, where the tunable stiffness layer includes a polymer material having a stiffness of 10 GPa/m or higher.

Example 21. The wafer bonding apparatus of one of examples 18 to 20, where the first chuck further includes a plurality of sensors configured to sense a degree of distortion of the first wafer on the first chuck and to send information related to the degree of distortion to the controller, where the controller determines the control signals according to the information received from the plurality of sensors.

Example 22. The wafer bonding apparatus of one of examples 18 to 21, where the plurality of sensors is further configured to sense the degree of distortion in-situ after placing the first wafer on the first chuck.

Example 23. A wafer bonding apparatus including: a first chuck in a processing chamber, the first chuck being configured to hold a first wafer, the first chuck including: a chuck body, and a tunable stiffness layer including a plurality of piezoelectric shear actuators, the tunable stiffness layer disposed below the chuck body; a controller configured to send signals to one of the plurality of piezoelectric shear actuators; and a vacuum line on the chuck body configured to apply a vacuum pressure from a vacuum pump to the first wafer; and an second chuck configured to hold a second wafer that is to be bonded with the first wafer, and where each of the plurality of piezoelectric shear actuators is configured to cause shear deformation of the tunable stiffness layer in a lateral direction, based on the signals from the controller.

Example 24. The wafer bonding apparatus of example 23, where the shear deformation of the tunable stiffness layer is synchronized in one direction.

Example 25. The wafer bonding apparatus of one of examples 23 or 24, where the first chuck further includes a plurality of sensors configured to: sense a degree of deformation of the first wafer on the chuck in-situ while causing the shear deformation of the tunable stiffness layer in the lateral direction; and send information related to the degree of distortion to the controller, where the controller updates the signals according to the information received from the plurality of sensors.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A wafer bonding apparatus comprising:
a first chuck in a processing chamber, the first chuck being configured to hold a first wafer, the first chuck comprising:
   a chuck body, and
   a tunable stiffness layer comprising a plurality of actuators, the plurality of actuators comprising a tunable stiffness material, the tunable stiffness layer being disposed below the chuck body;
a controller configured to send control signals to one or more of the plurality of actuators; and
a vacuum line on the chuck body configured to apply a vacuum pressure to the first wafer; and
a second chuck in the processing chamber, the second chuck being configured to hold a second wafer to be bonded with the first wafer; and
wherein a stiffness of the plurality of actuators is configured to change based on the control signals from the controller.

2. The wafer bonding apparatus of claim 1, wherein a change in the stiffness of the plurality of actuators is configured to compensate a surface stress at a surface of the first wafer facing the first chuck.

3. The wafer bonding apparatus of claim 1, wherein a change in the stiffness of the plurality of actuators is configured to compensate a surface strain at a surface of the first wafer facing the first chuck.

4. The wafer bonding apparatus of claim 1, wherein the plurality of actuators comprise a heat actuator, wherein the tunable stiffness material comprises a shape-memory material, and wherein the control signals are configured to provide thermal energy to the heat actuator.

5. The wafer bonding apparatus of claim 1, wherein the plurality of actuators comprise a pressure actuator, wherein the tunable stiffness material comprises a granular material, and wherein a stiffness of the tunable stiffness material changes based on a pressure exerted on the pressure actuator.

6. The wafer bonding apparatus of claim 1, wherein the plurality of actuators comprise an electric actuator, wherein the tunable stiffness material comprises a piezo-sensitive material, and wherein the control signals comprise electrical signals.

7. The wafer bonding apparatus of claim 1, wherein the plurality of actuators comprise a magnetic actuator, wherein the tunable stiffness material comprises a magnetorheological elastomer, and wherein the control signals comprise magnetic signals.

8. The wafer bonding apparatus of claim 1,
wherein the controller determines the control signals according to information received related to a degree of distortion of the first wafer on the first chuck.

9. The wafer bonding apparatus of claim 8, further comprising a metrology system, the metrology system comprises a sensor configured to sense the degree of distortion of the first wafer on the first chuck.

10. A method for wafer bonding, the method comprising:
applying vacuum pressure to a processing chamber of a wafer bonding apparatus through a first chuck;
placing a first wafer over the first chuck, the first wafer being held to the first chuck by the vacuum pressure, the first chuck comprising:
   a chuck body, and
   a tunable stiffness layer comprising a plurality of actuators, the plurality of actuators comprising a tunable stiffness material, the tunable stiffness layer being disposed below the chuck body;
sending control signals to one or more of the plurality of actuators; and
based on the control signals, activating the one or more of the plurality of actuators to change a stiffness of the tunable stiffness layer.

11. The method of claim 10, wherein changing the stiffness of the tunable stiffness layer compensates a surface stress at a surface of the first wafer facing the first chuck.

12. The method of claim 10, further comprising:
receiving, from a metrology system, information related to a degree of distortion of the first wafer on the first chuck; and
determining, at a controller, the control signals according to the information.

13. The method of claim 12, wherein the metrology system is a part of the processing chamber, further comprising adjusting the vacuum pressure based on the information.

14. The method of claim 10, further comprising:
placing a second wafer on a second chuck within the processing chamber; and
bonding the second wafer with the first wafer to form a bonded wafer.

15. The method of claim 14, further comprising:
after placing the second wafer on the second chuck, sending another control signals to another plurality of actuators of the tunable stiffness layer, the another plurality of actuators comprising the tunable stiffness material; and
based on the another control signals, activating the another plurality of actuators to further change the stiffness of the tunable stiffness layer, the another control signals indicative of a different setting of the stiffness of the tunable stiffness layer than the control signals.

16. The method of claim 14, further comprising after bonding the second wafer with the first wafer, receiving information related to a degree of distortion of the bonded wafer on the first chuck.

17. The method of claim 16, further comprising:
based on the information related to the degree of distortion of the bonded wafer, determine if the degree of distortion of the bonded wafer is below a threshold value; and
if the degree of distortion of the bonded wafer is greater than the threshold value, perform a re-bonding process by separating the bonded wafer into the first wafer and the second wafer and bonding the second wafer with the first wafer again.

18. A wafer bonding apparatus comprising:
a first chuck in a processing chamber, the first chuck being configured to hold a first wafer, the first chuck comprising a tunable stiffness layer comprising a first actuator, the first actuator comprising a tunable stiffness material;
a controller configured to send a control signal to the first actuator; and
a second chuck in the processing chamber, the second chuck being configured to hold a second wafer to be bonded with the first wafer, and
wherein a stiffness of the tunable stiffness layer is configured to change based on the control signal from the controller.

19. The apparatus of claim 18, further comprising:
a plurality of actuators coupled to the controller and configured to receive further control signals from the controller, wherein the stiffness of the tunable stiffness layer is configured to change based on the further control signals.

20. The apparatus of claim 18, wherein the tunable stiffness layer comprises a polymer material having a stiffness of 10 GPa/m or higher.

* * * * *